(12) United States Patent
Cho et al.

(10) Patent No.: US 11,456,557 B2
(45) Date of Patent: Sep. 27, 2022

(54) ELECTRONIC DEVICE INCLUDING HOUSING IN WHICH PROTECTIVE STRUCTURE IS DISPOSED

(71) Applicant: Samsung Electronics Co., Ltd., Gyeonggi-do (KR)

(72) Inventors: Yongwon Cho, Gyeonggi-do (KR); Gyunghoon Lee, Gyeonggi-do (KR); Minyong Kim, Gyeonggi-do (KR); Samyeol Kang, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/277,340

(22) PCT Filed: Oct. 8, 2019

(86) PCT No.: PCT/KR2019/013200
§ 371 (c)(1),
(2) Date: Mar. 18, 2021

(87) PCT Pub. No.: WO2020/080727
PCT Pub. Date: Apr. 23, 2020

(65) Prior Publication Data
US 2021/0351542 A1    Nov. 11, 2021

(30) Foreign Application Priority Data
Oct. 17, 2018    (KR) ........................ 10-2018-0123875

(51) Int. Cl.
*H05K 5/00*     (2006.01)
*G06F 1/16*     (2006.01)
*H01R 13/52*    (2006.01)

(52) U.S. Cl.
CPC ........... *H01R 13/52* (2013.01); *H05K 5/0069* (2013.01); *G06F 1/1626* (2013.01)

(58) Field of Classification Search
CPC ...... H01R 13/52; H05K 5/0069; H05K 5/069; H05K 5/0017; G06F 1/1626;
(Continued)

(56) References Cited

U.S. PATENT DOCUMENTS

| 9,426,919 B2 | 8/2016 | Wee et al. |
| 9,472,888 B2 | 10/2016 | Song et al. |

(Continued)

FOREIGN PATENT DOCUMENTS

| CN | 102403617 A | 4/2012 |
| CN | 202268555 U | 6/2012 |

(Continued)

OTHER PUBLICATIONS

European Search Report dated Oct. 15, 2021.
Chinese Search Report dated Dec. 17, 2021.

*Primary Examiner* — Rockshana D Chowdhury
(74) *Attorney, Agent, or Firm* — Cha & Reiter, LLC

(57) ABSTRACT

According to an embodiment, disclosed is an electronic device that includes an external interface module including a printed circuit board and at least one part disposed on the printed circuit board, a protective structure including at least one hole area that isolates at least a portion of the at least one part, and a housing that provides at least a bottom portion on which the protective structure is seated. Besides, it may be permissible to prepare various other embodiments speculated through the specification.

14 Claims, 10 Drawing Sheets

(58) Field of Classification Search
CPC ...... G06F 1/1656; G06F 1/1683; G06F 1/183; H04M 1/0277; H04M 1/0274; H04M 1/185

See application file for complete search history.

(56) References Cited

U.S. PATENT DOCUMENTS

| | | | |
|---|---|---|---|
| 9,474,170 B2 | 10/2016 | Kim et al. | |
| 9,634,503 B2 | 4/2017 | Taga et al. | |
| 9,876,273 B2 * | 1/2018 | Lui | H01Q 1/243 |
| 9,972,943 B2 | 5/2018 | Jeon et al. | |
| 10,178,782 B2 | 1/2019 | Gunes | |
| 10,627,858 B2 | 4/2020 | Seo et al. | |
| 10,651,587 B2 * | 5/2020 | Wu | H01R 13/44 |
| 10,910,170 B2 | 2/2021 | Choi et al. | |
| 11,073,872 B2 * | 7/2021 | Leopold | H05K 9/0024 |
| 11,133,595 B2 * | 9/2021 | Park | H01Q 21/08 |
| 2010/0263900 A1 | 10/2010 | DiVincenzo et al. | |
| 2013/0242481 A1 | 9/2013 | Kim et al. | |
| 2014/0104795 A1 * | 4/2014 | Wee | H05K 5/0247 361/752 |
| 2014/0268578 A1 * | 9/2014 | Dolci | H05K 9/0049 361/721 |
| 2014/0321079 A1 | 10/2014 | Kim et al. | |
| 2015/0244197 A1 | 8/2015 | Taga et al. | |
| 2015/0380862 A1 | 12/2015 | Song et al. | |
| 2017/0079154 A1 | 3/2017 | Gunes | |
| 2018/0090886 A1 | 3/2018 | Jeon et al. | |
| 2018/0299924 A1 | 10/2018 | Seo et al. | |
| 2019/0080860 A1 | 3/2019 | Choi et al. | |
| 2019/0208043 A1 | 7/2019 | Cha et al. | |
| 2021/0127514 A1 * | 4/2021 | Hwang | B32B 3/30 |

FOREIGN PATENT DOCUMENTS

| | | | |
|---|---|---|---|
| CN | 103313564 A | | 9/2013 |
| CN | 104518346 A | | 4/2015 |
| CN | 105322355 A | | 2/2016 |
| CN | 107293894 A | | 10/2017 |
| CN | 107926131 A | | 4/2018 |
| EP | 2244543 A2 | | 10/2010 |
| JP | 2014187526 A | | 10/2014 |
| JP | 2015162296 A | | 9/2015 |
| KR | 10-2010-0081696 A | | 7/2010 |
| KR | 10-2011-0080630 A | | 7/2011 |
| KR | 10-2015-0082042 A | | 7/2015 |
| KR | 20150082042 A | * | 7/2015 |
| KR | 10-2016-0102733 A | | 8/2016 |
| KR | 10-2017-0045090 A | | 4/2017 |
| KR | 10-2017-0070636 A | | 6/2017 |
| WO | 2018/043844 A1 | | 3/2018 |

\* cited by examiner

ELECTRONIC DEVICE INCLUDING HOUSING IN WHICH PROTECTIVE STRUCTURE IS DISPOSED

CROSS REFERENCE TO RELATED APPLICATIONS

This application is a National Phase Entry of PCT International Application No. PCT/KR2019/013200, which was filed on Oct. 8, 2019, and claims a priority to Korean Patent Application No. 10-2018-0123875, which was filed on Oct. 17, 2018, the contents of which are incorporated herein by reference.

TECHNICAL FIELD

Embodiments of the disclosure described herein relate to a protective structure for protecting parts of an electronic device.

BACKGROUND ART

An electronic device such as a mobile device, which is a necessity of a user, includes an external interface module for the purpose of connection with various external devices (e.g., connection with an external communication device or connection with a charging device). That is, the external interface module may be disposed in an interface hole, and at least a portion of the external interface module may be exposed to the outside. Accordingly, the mobile device may be connected with an external device (e.g., a communication device or a charger cable).

DISCLOSURE

Technical Problem

When a connecting structure between the external interface module and the interface hole described above is not completely sealed, fluid such as moisture or oil may flow into the mobile device from the outside to cause damage to the inside of the mobile device.

Accordingly, an aspect of the disclosure is to provide an electronic device including a housing that includes a protective structure for firmly seating an external interface module on a housing of a mobile device and preventing inflow of fluid or preventing damage caused by fluid.

Furthermore, another aspect of the disclosure is to provide an electronic device for more simplifying the form of a housing by separately placing a protective structure protecting an external interface module in a housing of a mobile device or by forming the protective structure through injection molding.

Technical Solution

An electronic device according to an embodiment of the disclosure includes an external interface module including a printed circuit board and at least one part disposed on the printed circuit board, a protective structure including at least one hole area that isolates at least a portion of the at least one part, and a housing including at least a bottom portion on which the protective structure is seated.

Advantageous Effects

According to the embodiments of the disclosure, waterproof, dustproof, and reinforcing functions for the external interface module may be provided by protecting various electronic parts included in the external interface module using the protective structure.

Furthermore, the protective structure may be separately provided or may be formed by injection molding. Accordingly, machining of the housing at least partially formed of a metallic material may be simplified, and thus a reduction in housing machining time and housing material saving may be achieved.

In addition, the disclosure may provide various effects that are directly or indirectly recognized.

DESCRIPTION OF DRAWINGS

With regard to description of the drawings, identical or similar reference numerals may be used to refer to identical or similar components.

MODE FOR INVENTION

Hereinafter, various embodiments of the disclosure may be described with reference to accompanying drawings. Accordingly, those of ordinary skill in the art will recognize that modification, equivalent, and/or alternative on the various embodiments described herein can be variously made without departing from the scope and spirit of the disclosure.

Figure 1:
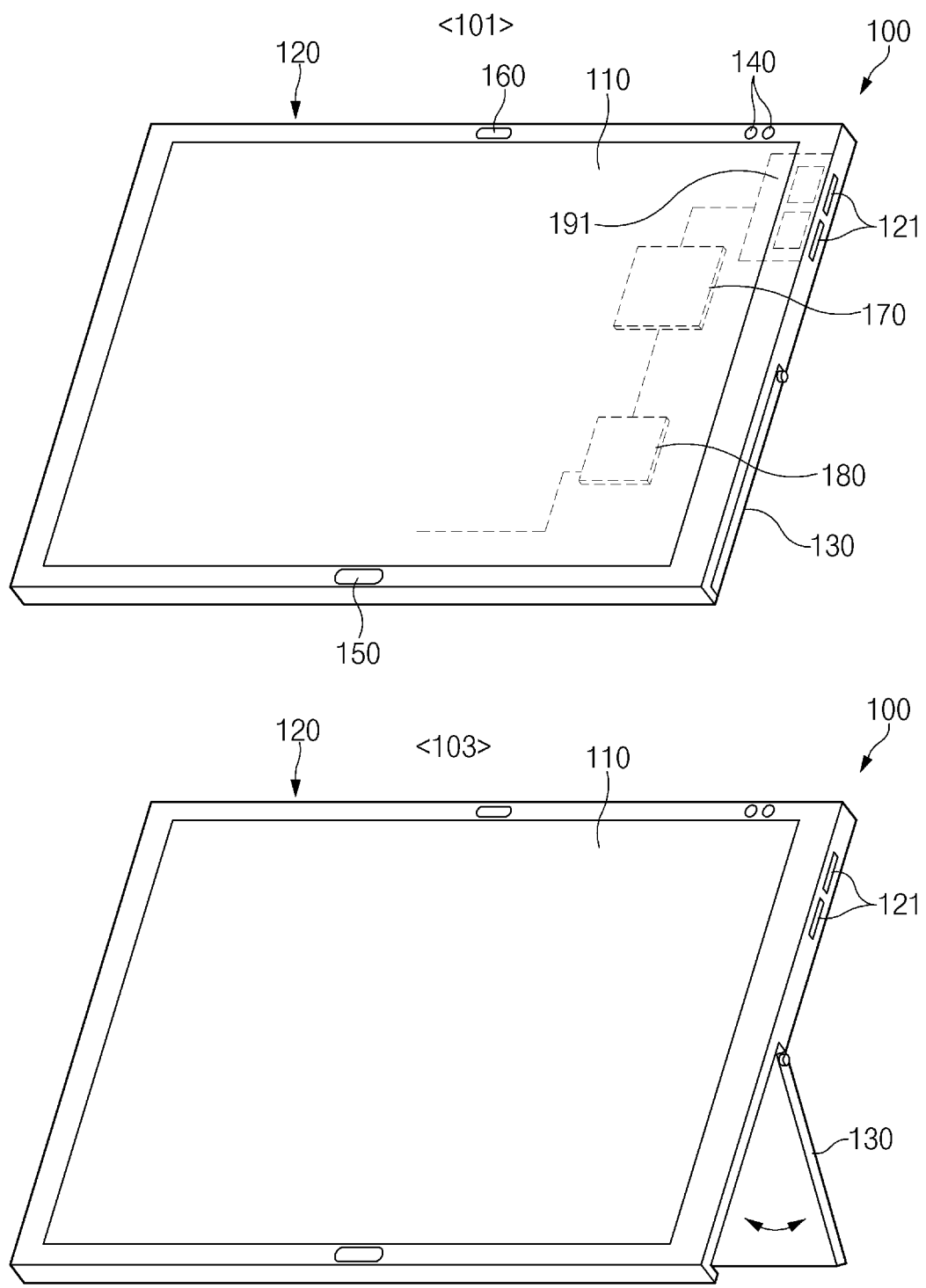
FIG. 1 is a view illustrating one example of the exterior of an electronic device according to various embodiments.

FIG. 1 is a view illustrating one example of the exterior of an electronic device according to various embodiments.

In FIG. 1, state 101 is a view illustrating a state in which a stand 130 of the electronic device 100 is folded, and state 103 illustrates a state in which the electronic device 100 is supported, with the stand 130 of the electronic device 100 unfolded with a predetermined angle.

Referring to state 101 and state 103, the electronic device 100 according to an embodiment of the disclosure may include a display 110, a housing 120, the stand 130, a sensor module 140, a physical button 150, a speaker 160, a processor 170, communication circuitry 180, and an external interface module 191. The electronic device 100 may have, for example, a quadrangular shape. The electronic device 100 may have a predetermined area and may have a specified thickness (e.g., a small thickness of 2 cm or less) by which the electronic device 100 is easy to carry and grasp. The electronic device 100 may be provided to be portable. Here, a technology to which a protective structure of the disclosure is applied is not limited to the kind or type of the electronic device 100, and the disclosure may be applied to any forms of electronic devices as long as the electronic devices have a structure including an external interface module.

The display 110 may output a screen related to execution of a specified function, by using a battery (not illustrated) in the electronic device 100 or an external power supply. The display 110 may be implemented with various display devices such as a liquid crystal display or an OLED display. According to an embodiment, the display 110 may be formed of a touch screen and may receive a user's touch input (e.g., a finger touch or a stylus touch) and transfer the touch input to the processor 170 to support processing the user input. The display 110 may output at least one content item received from an external device connected through the external interface module 191 or contents corresponding to a screen that is being output on an external communication device. Alternatively, when charging power is supplied through the external interface module 191, the display 110 may output a screen interface corresponding to the charging state.

The housing 120 may form at least a portion of the exterior of the electronic device 100, and the entire housing 120 may be formed of metal, or at least a portion of the housing 120 may be formed of a plastic material. Alternatively, at least a portion of the housing 120 may be formed of a metallic material. For example, according to necessity, the housing 120 may be formed of a metallic material, and a structure formed by injection molding may be additionally disposed therein. According to an embodiment, the display 110 may be seated on one side (e.g., a front surface) of the housing 120. An adhesive member or an adhesive, or a coupling member such as a hook or a screw, may be additionally disposed to fix the display 110 to the housing 120. The housing 120 may be formed in a hollow box form such that the display 110 is seated therein. In this case, the housing 120 may include a plurality of sidewalls that at least partially face edges of the display 110. The housing 120 may include a lower housing in which at least one of the display 110 or a part (e.g., a printed circuit board on which at least one of the processor 170 or the communication circuitry 180 is placed) is placed and an upper housing or a bezel housing that surrounds the exterior of the display 110.

Interface holes 121 through which at least a portion of the external interface module 191 is exposed to the outside may be disposed in one sidewall in a predetermined position among the sidewalls. Although two interface holes 121 are illustrated in the drawing, the disclosure is not limited thereto. For example, when the external interface module 191 includes only one socket (or connector) so as to be connected with an external device (e.g., a communication device or a charging device), at least one interface hole 121 may be formed. Alternatively, when the external interface module 191 includes three sockets, at least three interface holes 121 may be formed.

The interface holes 121 may be formed in the one sidewall in an oval shape that is longer in the lengthwise direction or in a quadrangular shape having rounded corners. The shape or size of each of the interface holes 121 may be determined depending on the form of a connected cable or the form of an external device. With respect to the illustrated drawing, the interface hole 121 may be formed in the form of a passage that passes through the one sidewall of the housing 120 and connects the inside of the housing 120 and the outside in a direction parallel to the surface on which the display 110 is placed. An outer side of the interface hole 121 (e.g., one side of the interface hole 121 that is formed on the outside of the housing 120) and an inner side of the interface hole 121 (e.g., one side of the interface hole 121 that is formed on the inside of the housing 120) may have the same shape and size. Alternatively, according to necessity, the outer side and the inner side of the interface hole 121 may have different sizes. A portion of the protective structure may be disposed on at least a portion of an inner wall of the interface hole 121 (e.g., a wall surface of a passage formed through the housing 120) or on a portion around the inner wall of the hole 121.

The stand 130 may be disposed on one side of a rear surface of the electronic device (e.g., a rear surface of the display 110, when the surface on which the display 110 is disposed is referred to as a front surface) such that the electronic device 100 is supported at a predetermined angle. The stand 130 may be provided, for example, by deforming at least a portion of the housing 120. The stand 130 may include a hinge structure such that a portion connected with the housing 120 is rotatable and may include a support that is connected to the hinge structure to support the electronic device 100 and that is disposed so as to be rotatable. When the stand 130 is disposed to be brought into contact with the housing 120, the rear surface of the electronic device 100 may have a flat state after the stand 130 is seated in the housing 120. In this regard, a seating area on which the stand 130 is seated may be formed on at least a partial area of one side of a rear surface of the housing 120.

The sensor module 140 may include at least one sensor for sensing various pieces of information related to operation of the electronic device 100. For example, the sensor module 140 may include a camera or an image sensor that is capable of obtaining an image of a subject. The sensor module 140 may include at least one of an iris sensor related to recognition of the user's iris, a proximity sensor for sensing approach of an object, or an illuminance sensor for sensing external illuminance. According to various embodiments, the sensor module 140 may further include at least one of a position detection sensor for detecting a position, an acceleration sensor, or a terrestrial magnetism sensor.

At least a portion of the physical button 150 may be disposed on one side of the housing 120 of the electronic device 100. For example, the physical button 150 may include at least one of a home button or a power button. Furthermore, the electronic device 100 may further include at least one of physical buttons for volume control. An upper end portion of the physical button 150 may be disposed to be exposed to the outside through a button hole disposed on one side of the housing 120. For example, an upper end surface of the physical button 150 may be disposed at the same height as a surface around the button hole of the housing 120, or may be disposed in a lower position than the surface around the button hole of the housing 120.

The speaker 160 may output audio signals according to execution of functions of the electronic device 100. For example, the speaker 160 may operate as a receiver that outputs an audio signal according to execution of a telephone call function of the electronic device 100. At least a portion of the speaker 160 may be disposed on one side of the housing 120. Additionally, the electronic device 100 may further include a microphone for collecting the user's voice. In addition, the electronic device 100 may further include an ear jack for connection of earphones.

The processor 170 may be disposed inside the housing 120. The processor 170 may be disposed so as not to be exposed to the outside (or so as not to be visible from the outside) by being covered (or hidden) by the display 110. The processor 170 may be operatively connected with at least one of various components of the electronic device 100, for example, the sensor module 140, the physical button 150, the speaker 160, and the external interface module 191. According to various embodiments, when an external device is connected through the external interface module 191, the processor 170 may identify the type of the external device and may perform processing for operation of the external device. For example, the processor 170 may establish a communication channel with the external device and may process data transmission/reception with the external device, or may receive power from the external device when the external device is a charging device.

The communication circuitry 180 may be located inside the housing 120 similarly to the processor 170 and may be disposed so as not to be exposed to the outside by being covered by the display 110. The communication circuitry 180 may be operatively connected with the processor 170 and may support a communication function of the electronic device 100 under the control of the processor 170. For example, the communication circuitry 180 may establish a base station based communication channel, or may establish a short-range communication channel with at least one of Wi-Fi or Bluetooth. The communication circuitry 180 may be electrically connected with at least a portion of the housing 120 and may radiate or receive a signal through the at least a portion of the housing 120. In this regard, the at least a portion of the housing 120 may be formed of a metallic material. At least one of the processor 170 or the communication circuitry 180 described above may be mounted on a printed circuit board and may be disposed inside the housing 120.

The external interface module 191 may be disposed on one side of an inside edge of the housing 120. For example, the external interface module 191 may be disposed inward of an edge of the area where the interface hole 121 is formed in the housing 120. The external interface module 191 may include, for example, at least one of a printed circuit board, a socket, or an electronic part connected to the socket. At least a portion of the socket of the external interface module 191 may be disposed so as to be visible from the outside through the interface hole 121. The external interface module 191 may include at least one electrode or port in relation to connection of an external device. For example, the external interface module 191 may support connection with various external devices, such as USB connection, UART connection, charger connection, and earphone connection. The external interface module 191 may include a plurality of sockets to support connection with a plurality of external devices.

Hereinafter, the protective structure disposed for a waterproof, dustproof, or reinforcing function of the external interface module 191 according to an embodiment of the disclosure, the shape of a portion of the housing 120, and a stacked form of the external interface module 191 and the protective structure will be described with reference to FIG. 2.

Figure 2:
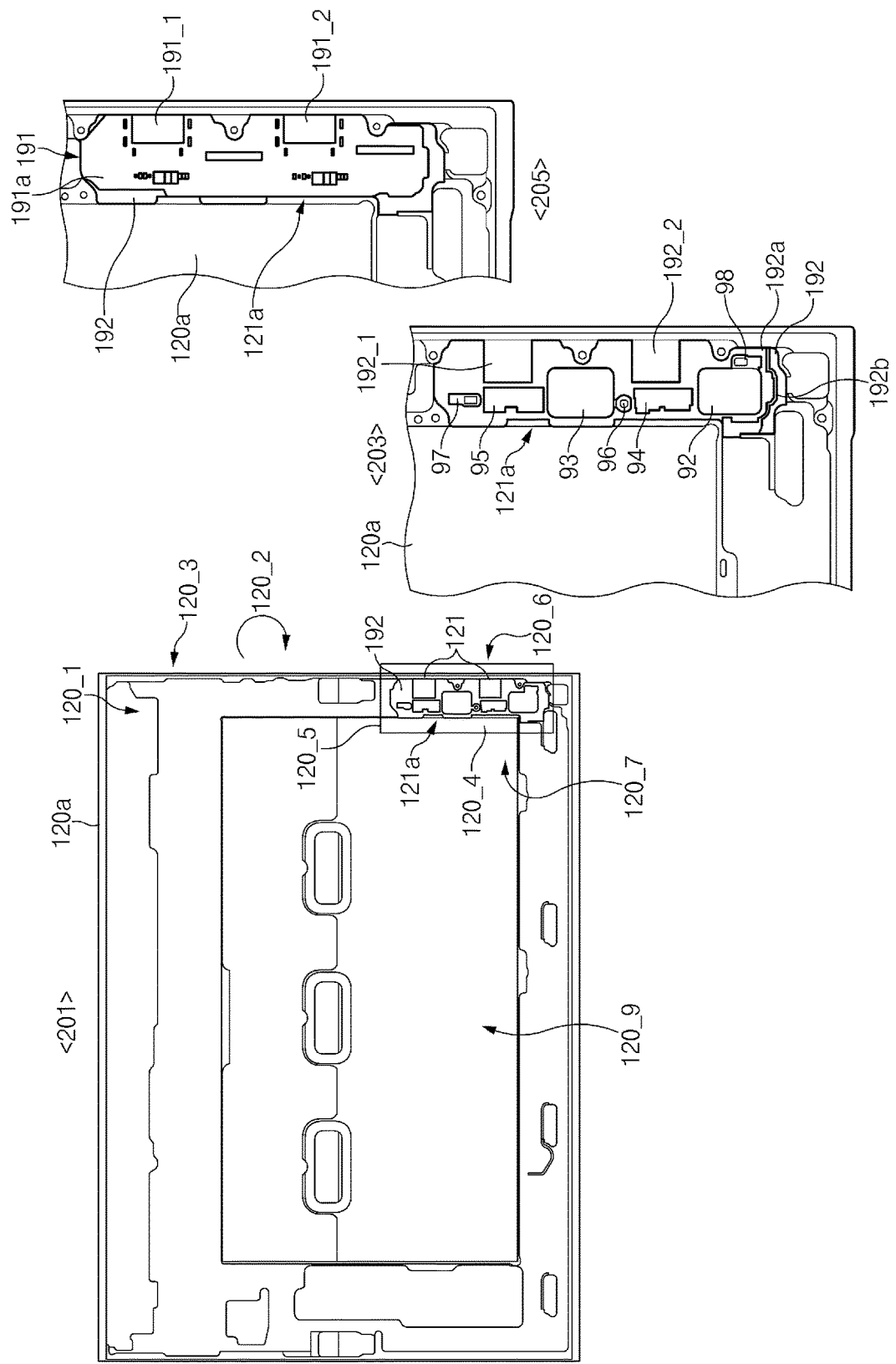
FIG. 2 is a view illustrating one example of a housing of the electronic device according to various embodiments.

FIG. 2 is a view illustrating one example of the housing of the electronic device according to various embodiments.

Referring to FIG. 2, the housing 120 of the electronic device according to various embodiments may include a lower housing 120a as in state 201. As in state 201, computerized numerical control (CNC) machining may be performed on the inside of the lower housing 120a such that various electronic device structures are seated thereon. State 203 illustrates the shape of a protective structure 192 disposed on the area where the external interface module 191 among various components of the electronic device 100 is to be seated. One side (the interface hole(s) 121 described above with reference to FIG. 1) of the lower housing 120a of the electronic device may be disposed. The protective structure 192 may be disposed on an area adjacent to the area where the interface hole 121 is disposed (e.g., a bottom portion 121a of the lower housing 120a). In this regard, the bottom portion 121a may be formed to be lower (or recessed) than a surrounding portion, or may be formed in a recess shape. At least a portion of the protective structure 192 may be formed of, for example, at least one of rubber, plastic, polycarbonate (PC), or polycarbonate+glassfiber30 (PC+GF30). State 203 illustrates one example of the shape of the protective structure 192, and state 205 illustrates one example of the shape of the external interface module 191 seated on the protective structure 192.

Referring to state 203, the protective structure 192 may include, for example, a substrate 192a (or a substrate layer) having a predetermined thickness and area, a guide wall 192b having a predetermined width and height from a surface of the substrate 192a on one side of the substrate 192a and disposed in a position spaced apart inward from one edge of the substrate 192a by a predetermined length, and hole areas 192_1, 192_2, 92, 93, 94, 95, 96, 97, and 98 disposed in various positions of the substrate 192a.

The guide wall 192b may guide (or support) an edge of the external interface module 191 in a coupling process of the external interface module 191 and the protective structure 192 while the external interface module 191 is being seated. In this regard, the guide wall 192b may be formed in a shape similar to that of one side of the external interface module 191. For example, the guide wall 192b may be formed in the same shape as, or a shape similar to, that of a side surface of the edge of the external interface module 191.

In the coupling process, the guide wall 192b may be used for alignment of the protective structure 192 and the external interface module 191 (e.g., alignment of the peripheries of the external interface module 191 and the protective structure 192 in the direction in which the protective structure 192 is seated). Furthermore, when liquids such as water are introduced from the outside, the guide wall 192b may prevent diffusion of the introduced liquids into the electronic device 100 (e.g., into an area inward of the area where the external interface module 191 is disposed). Furthermore, depending on the shape of the guide wall 192b, the guide wall 192b may guide the introduced liquids into a specified area inside the lower housing 120a to prevent the introduced liquids from collecting in an area related to the external interface module 191. In addition, the guide wall 192b may prevent introduced water from flowing below the lower housing 120a with respect to the illustrated drawing.

Referring to state 205, the external interface module 191 may include a printed circuit board 191a, a first socket 191_1, a second socket 191_2, and other parts (e.g., chipsets, and electronic parts).

The hole areas 192_1, 192_2, 92, 93, 94, 95, 96, 97, and 98 may surround the components to prevent the seated components of the external interface module 191, for example, the first socket 191_1, the second socket 191_2, and the other parts from being corroded by introduced water. In this regard, the hole areas 192_1, 192_2, 92, 93, 94, 95, 96, 97, and 98 may include, for example, the first socket hole 192_1, the second socket hole 192_2, the first chipset hole 92, the second chipset hole 93, the first electronic part hole 94, the second electronic part hole 95, the first contact hole 97, the second contact hole 98, and the boss hole 96.

The first socket hole 192_1 and the second socket hole 192_2 may be areas where sockets disposed in the external interface module 191 are seated, respectively. The first socket hole 192_1 and the second socket hole 192_2 may each be surrounded by three sidewalls and may have no separate sidewall in one side direction. For example, the first socket hole 192_1 and the second socket hole 192_2 may have a shape in which a sidewall facing toward the interface hole 121 is removed. In this regard, the first socket hole 192_1 and the second socket hole 192_2 may be disposed to be biased to an edge of the substrate 192a. The first socket hole 192_1 and the second socket hole 192_2 may each be formed in a shape corresponding to the shape of one side of a socket of the external interface module 191. The first socket hole 192_1 and the second socket hole 192_2 may be formed in shapes corresponding to the shapes of the first socket 191_1 and the second socket 191_2 of the external interface module 191. For example, the first socket hole 192_1 may be formed in a shape corresponding to a structure of the first socket 191_1 of the external interface module 101 that further protrudes beyond a surrounding portion with respect to one surface.

A first chipset and a second chipset disposed in the external interface module 191 may be seated in the first chipset hole 92 and the second chipset hole 93. A first electronic part and a second electronic part disposed in the external interface module 191 may be disposed in the first electronic part hole 94 and the second electronic part hole 95. Electrical contacts disposed in the external interface module 191 on one side of a bottom surface of the lower housing 120a may be seated in the first contact hole 97 and the second contact hole 98.

The boss hole 96 may be disposed on one side of the substrate 192a and may be vertically formed through the substrate 192a. For example, when a boss is disposed on the bottom portion 121a of the lower housing 120a, the boss hole 96 may be disposed such that the boss formed on the bottom portion 121a of the lower housing 120a is exposed to the outside, and may be hidden by screw coupling and display 110 coupling. With regard to the illustrated drawing, it has been described that one boss hole 96 is provided. However, the disclosure is not limited thereto. For example, for a purpose similar to that of the boss hole 96, openings formed to avoid a plurality of bosses formed on the bottom of the lower housing 120a may be disposed in a predetermined area on a right side of the substrate 192a.

Figure 3:
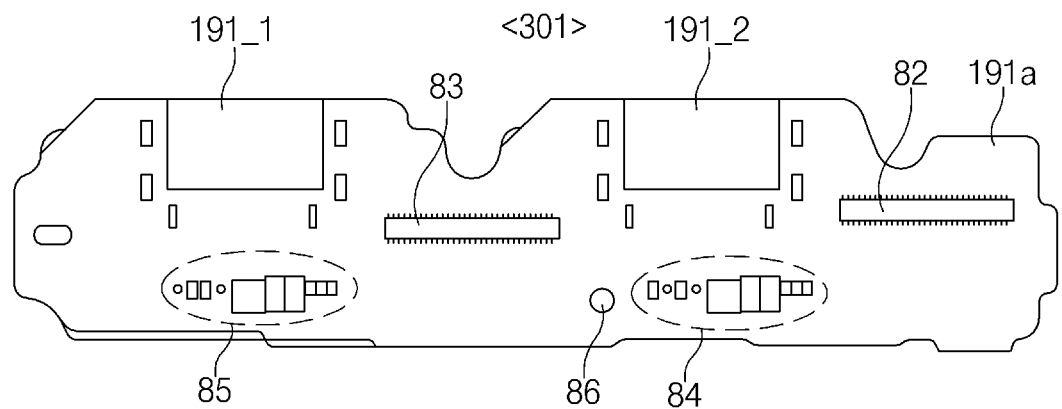
FIG. 3 is a view illustrating one example of an external interface module according to various embodiments.
Figure 3:
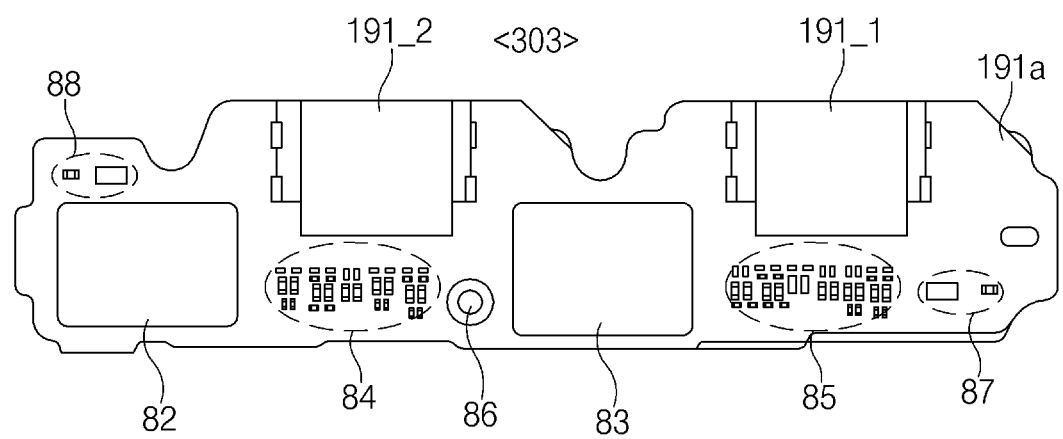

FIG. 3 is a view illustrating one example of the external interface module according to various embodiments.

Referring to FIG. 3, as mentioned above, the external interface module 191 may include the printed circuit board 191a, the first socket 191_1, the second socket 191_2, a first chipset 82, a second chipset 83, a first electronic part 84, a second electronic part 85, a first contact 87, or a second contact 88. Here, state 301 illustrates an upper surface of the external interface module 191, and state 303 illustrates a lower surface of the external interface module 191. A fixing hole 86 for fixing the external interface module 191 may be disposed on one side of the external interface module 191. The fixing hole 86 may be aligned with the boss hole 96 disposed in the protective structure 192. The boss formed on one side of the lower housing 120a may be exposed to the outside through the boss hole 96 and the fixing hole 86, and a coupling member such as a screw may firmly fix the external interface module 191 to the lower housing 120a by pressing a portion around the fixing hole 86 while being inserted into the boss.

Referring to state 301 or state 303, the printed circuit board 191a may be formed in a shape in which the horizontal axis is longer than the vertical axis. The printed circuit board 191a may be formed by stacking a plurality of layers. The first socket 191_1 and the second socket 191_2 may be disposed on one side of the printed circuit board 191a. The first socket 191_1 and the second socket 191_2 may be formed in the same shape or a similar shape. Alternatively, the shapes of the first socket 191_1 and the second socket 191_2 may differ from each other depending on at least one of the type of connected external device or the shape of a cable. At least a portion of the first socket 191_1 and at least a portion of the second socket 191_2 may be formed of a metallic material. The sockets 191_1 and 191_2 may be formed in a container shape that is open at one side so as to be coupled with at least one of an external device or a cable. For example, at least parts of front end portions of the sockets 191_1 and 191_2 may be open such that an external device or a cable is inserted thereinto.

The chipsets 82 and 83, the electronic parts 84 and 85, and the contacts 87 and 88 may be disposed on the printed circuit board 191a. The chipsets 82 and 83 may be electrically connected with external devices inserted into the first socket 191_1 and the second socket 191_2 and may transmit and receive signals required for operations of the external devices with the external devices. The electronic parts 84 and 85 may include, for example, various physical elements for supporting transmitting and receiving signals with the external devices inserted into the sockets 191_1 and 191_2. For example, the electronic parts 84 and 85 may include various physical elements, such as a capacitor, a resistor, and an inductor, and wiring connecting the physical elements. The contacts 87 and 88 may be, for example, surface-mounted device (SMD) gasket contact portions. The sockets 191_1 and 191_2, the electronic parts 84 and 85, and the contacts 87 and 88 described above may be corroded or damaged by introduced water or moisture introduced from the outside. Accordingly, the sockets 191_1 and 191_2, the electronic parts 84 and 85, and the contacts 87 and 88 may be disposed in the hole areas 192_1, 192_2, 92, 93, 94, 95, 96, 97, and 98 of the protective structure 192 and may be sealed from the outside. Thus, damage or corrosion by water infiltration may be prevented. Alternatively, the protective structure 192 may be disposed such that introduced water does not collect around the parts, thereby preventing the parts of the external interface module 191 from being corroded by collected water.

Figure 4:
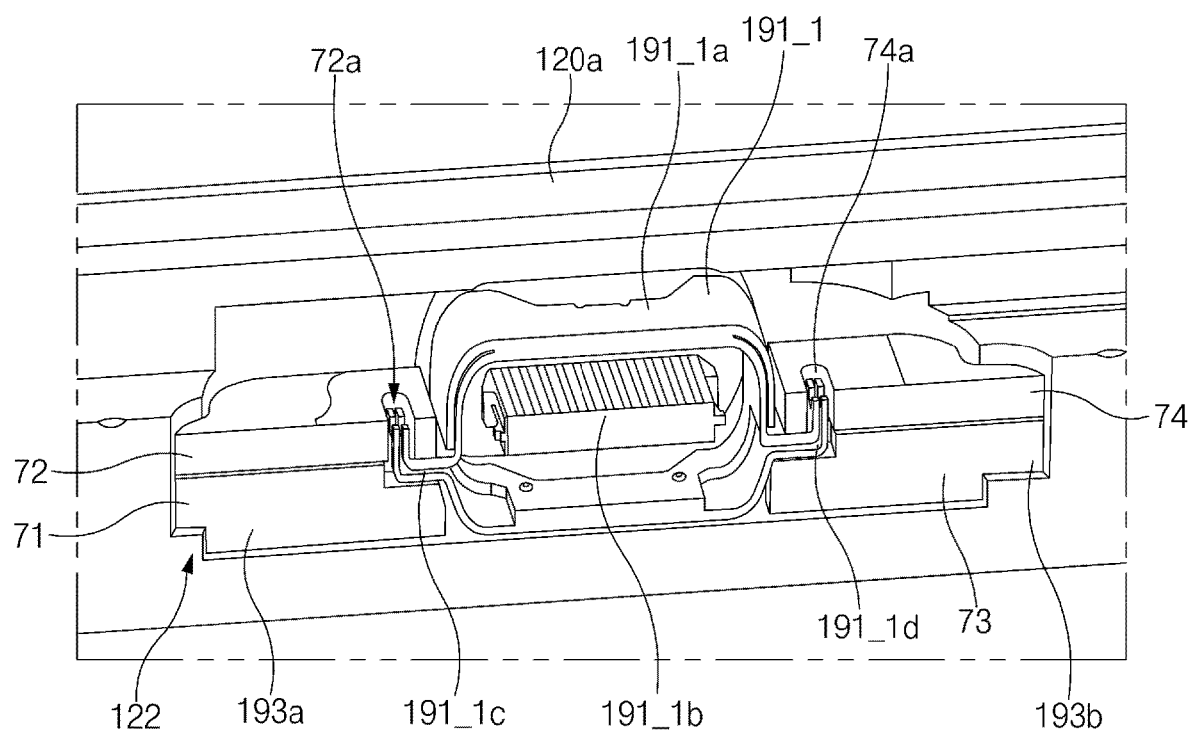
FIG. 4 is a view illustrating a structure in which the external interface module and a portion of a protective structure are stacked in the housing according to various embodiments.

FIG. 4 is a view illustrating a structure in which the external interface module and a portion of the protective structure are stacked in the housing according to various embodiments.

Referring to FIG. 4, the first socket 191_1, as illustrated, may include a socket case 191_1a, at least a portion of which is disposed in the interface hole 121 formed on one side of the lower housing 120a, a contact terminal 191_1b electrically connected with external devices, and wings 191_1c and 191_1d for fixing the socket case 191_1a. The socket case 191_1a may be formed, for example, in a hollow container shape and may have the wings 191_1c and 191_1d disposed on opposite sides thereof. The contact terminal 191_1*b* may have a plurality of terminals disposed therein for electrical connection with an external device.

The lower housing 120*a* may include, in the area where the interface hole 121 is disposed, a seating portion 122 on which the first socket 191_1 is seated. For example, a first seating module 193*a* supporting a first side (e.g., the left side with respect to the illustrated drawing) of the first socket 191_1 and a second seating module 193*b* supporting a second side (e.g., the right side with respect to the illustrated drawing) of the first socket 191_1 may be disposed on the seating portion 122. The first seating module 193*a* and the second seating module 193*b* may be at least parts of the above-described protective structure 192, or may be components that are separately formed in a different form from the protective structure 192 and that are disposed on the seating portion 122 of the lower housing 120*a*.

The first seating module 193*a* may include, for example, a first lower seating module 71 supporting a lower portion of the first socket 191_1 and a first middle seating module 72 supporting a middle portion and an upper portion of the first socket 191_1. The first lower seating module 71 and the first middle seating module 72 may be stacked on each other. The first seating module 193*a* may include a first fixing groove 72*a* to which the first wing 191_1*c* of the first socket 191_1 is fixed. The first fixing groove 72*a* may be formed, for example, through one side of the first lower seating module 71 and the first middle seating module 72.

The second seating module 193*b* may be formed in a shape similar to that of the first seating module 193*a*. That is, the second seating module 193*b* may include a second lower seating module 73 and a second middle seating module 74 stacked on each other and may include a second fixing groove 74*a* that is formed through the second lower seating module 73 and the second middle seating module 74 and to which the second wing 191_1*d* of the first socket 191_1 is fixed.

Figure 5:
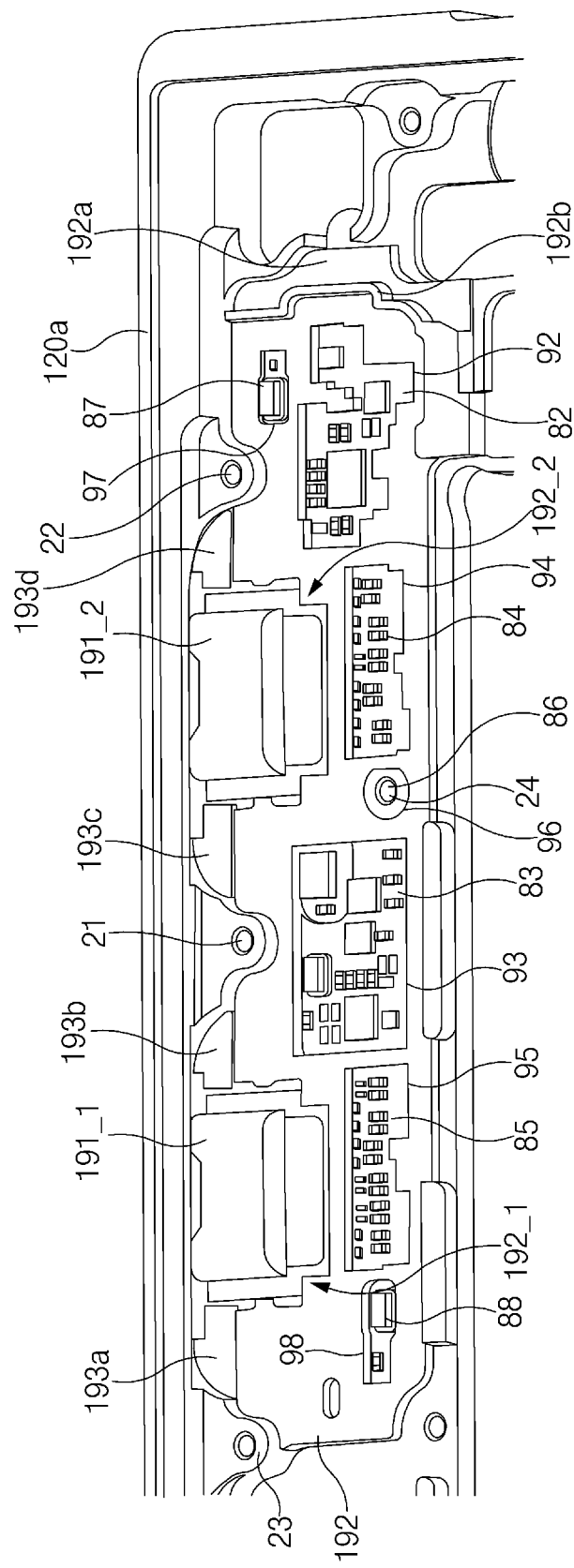
FIG. 5 is a view in which some components are removed such that one surface of the external interface module seated in the protective structure according to various embodiments is visible.

FIG. 5 is a view in which some components are removed such that one surface of the external interface module seated in the protective structure according to various embodiments is visible.

Referring to FIG. 5, the protective structure 192 may be disposed on one side of the lower housing 120*a*. The lower housing 120*a* may be at least a portion of the housing 120 described above with reference to FIG. 1. The protective structure 192 may include the substrate 192*a* (or the substrate layer) and the guide wall 192*b*, and the various hole areas may be formed in the substrate 192*a*. The various components disposed in the external interface module 191 may be disposed in the protective structure 192. For example, at least a portion of the first socket 191_1 of the external interface module 191 may be disposed in the first socket hole 192_1 of the protective structure 192. Similarly, at least a portion of the second socket 191_2 of the external interface module 191 may be disposed in the second socket hole 192_2 of the protective structure 192.

The first chipset 82 of the external interface module 191 may be seated in the first chipset hole 92 of the protective structure 192, and the second chipset 83 of the external interface module 191 may be seated in the second chipset hole 93 of the protective structure 192. Similarly, the first electronic part 84 and the second electronic part 85 of the external interface module 191 may be seated in the first electronic part hole 94 and the second electronic part hole 95 of the protective structure 192. The first contact 87 and the second contact 88 of the external interface module 191 may be seated in the first contact hole 97 and the second contact hole 98 of the protective structure 192, respectively.

The fixing hole 86 of the external interface module 191 may be aligned with the boss hole 96 disposed on one side of the protective structure 192. A boss 24 formed on the lower housing 120*a* may be disposed to be exposed to the outside through the boss hole 96 of the protective structure 192 and the fixing hole 86 of the external interface module 191. The protective structure 192 and the external interface module 191 may have, on sides thereof, grooves in which bosses (e.g., 21, 22, and 23) are disposed.

According to various embodiments, the first seating module 193*a* and the second seating module 193*b* may be disposed around the first socket 191_1 so as to be located on a portion of the lower housing 120*a* adjacent to the area where the interface hole is disposed or between the sidewall of the lower housing 120*a* in which the interface hole is disposed and the protective structure 192. The first seating module 193*a* and the second seating module 193*b* may firmly fix the first socket 191_1 and may fill the clearance of the first socket 191_1. Similarly, a third seating module 193*c* and a fourth seating module 193*d* may be disposed in the area where the second socket 191_2 is disposed between the sidewall of the lower housing 120*a* and the protective structure 192. The third seating module 193*c* and the fourth seating module 193*d* may firmly fix the second socket 191_2 and may fill the clearance (or, gap or tolerance) of the second socket 191_2 (the clearance between the second socket 191_2 and a surrounding housing).

Figure 6:
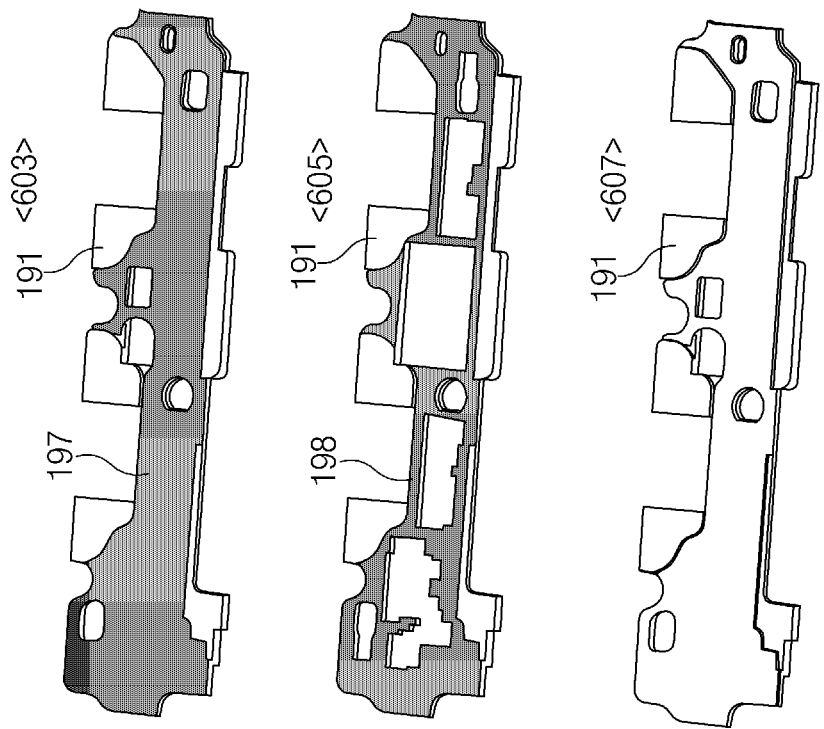
FIG. 6 is a view illustrating an example of an adhesive structure of the protective structure according to various embodiments.
Figure 6:
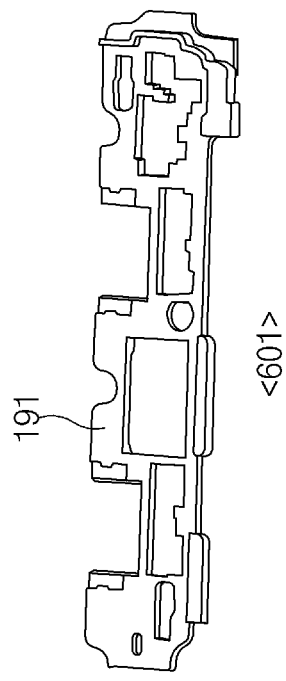

FIG. 6 is a view illustrating an example of an adhesive structure of the protective structure according to various embodiments.

Referring to state 601 of FIG. 6, the protective structure 192 according to an embodiment may include a substrate that has a predetermined length and is flat and may include a plurality of hole areas formed in the substrate. Additionally, a boss hole for boss coupling may be disposed in the protective structure 192. Furthermore, a guide wall may be disposed on one side of the protective structure 192 and may prevent a movement of introduced water, or may guide a movement of introduced water along a specified path.

According to various embodiments, as in state 603, a first type adhesive member 197 may be disposed on one side of the protective structure 192. The first type adhesive member 197 may be attached to a lower surface of the protective structure 192 and may be disposed to cover at least some of the hole areas of the protective structure 192. For example, the first type adhesive member 197 may be formed to cover at least some of the first socket hole 192_1, the second socket hole 192_2, the first electronic part hole 94, the second electronic part hole 95, the first contact hole 97, and the second contact hole 98 of the protective structure 192. According to various embodiments, the first type adhesive member 197 may be disposed so as not to cover the first socket hole 192_1 and the second socket hole 192_2. The first type adhesive member 197 may be formed to cover a partial area of the first chipset hole 92 and may be formed to cover at least a portion (or all) of the second chipset hole 93. Alternatively, the first type adhesive member 197 may be formed to cover only partial areas of the first contact hole 97 and the second contact hole 98.

According to various embodiments, as in state 605, a second type adhesive member 198 may be disposed on one side of the protective structure 192. The second type adhesive member 198 may include, for example, an adhesive member attached to only a skeleton of the protective structure 192. That is, the second type adhesive member 198 may be disposed on at least a partial area of the substrate 192*a* so as not to intrude into the first socket hole 192_1, the second socket hole 192_2, the first chipset hole 92, the second chipset hole 93, the first electronic part hole 94, the second electronic part hole 95, the first contact hole 97, and the second contact hole 98.

According to various embodiments, as in state 607, the protective structure 192 may be formed on one side of the lower housing 120a by injection molding without a separate adhesive member. In this case, a separate adhesive member may not be disposed, and on one side of the lower housing 120a, the protective structure 192 may be formed of at least one of an injection-molded plastic structure, rubber, an elastic material, or a polymer material.

Figure 7:
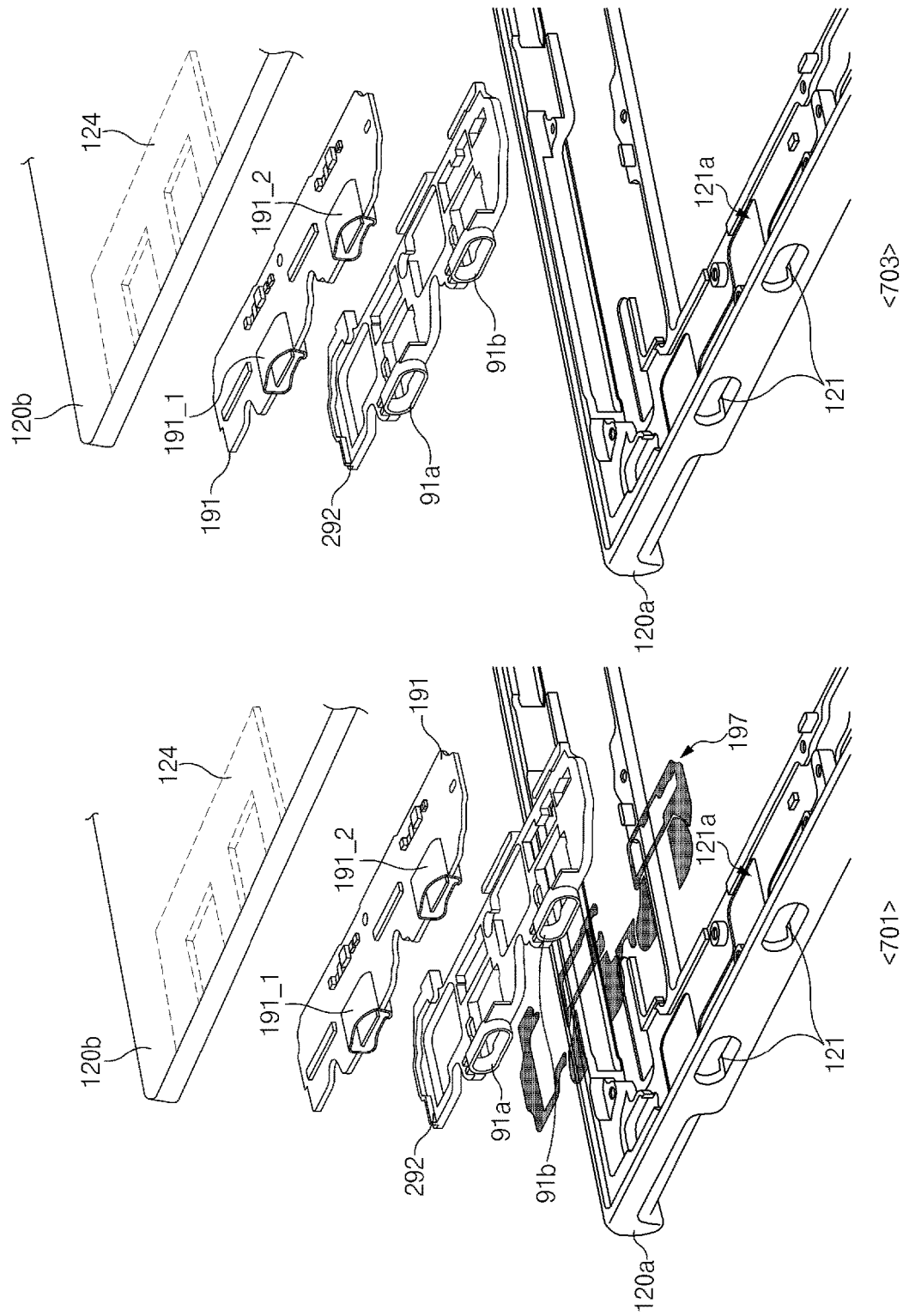
FIG. 7 is a view illustrating one example of a structure including the external interface module, the protective structure, and some components of the housing according to various embodiments.

FIG. 7 is a view illustrating one example of a structure including the external interface module, the protective structure, and some components of the housing according to various embodiments.

Referring to state 701 of FIG. 7, the electronic device 100 may include an upper housing 120b, the lower housing 120a, the external interface module 191, a protective structure 292, and an adhesive member 297. Alternatively, referring to state 703 of FIG. 7, the electronic device 100 may include the upper housing 120b, the lower housing 120a, the external interface module 191, and the protective structure 292.

Referring to state 701, the external interface module 191, the protective structure 292, and the adhesive member 297 may be disposed between the upper housing 120b and the lower housing 120a. Here, the adhesive member 297 may be disposed on one side of the lower housing 120a (e.g., the bottom portion 121a adjacent to the area where the interface hole 121 is disposed). In this regard, at least part of the bottom portion 12a may be formed in a recess shape formed to be lower than a surrounding portion. The adhesive member 297 may be formed to be similar to at least a portion of the shape of the protective structure 292. The protective structure 292 may be disposed on the adhesive member 297 and may be fixed to the lower housing 120a by the adhesive member 297. Lower opening regions of various hole areas formed in the protective structure 292 may be fixed to the lower housing 120a by the adhesive member 297 and may be closed by the housing bottom portion 121a. That is, the bottom portion 121a of the lower housing 120a may close openings of the hole areas of the protective structure 292 (e.g., the lower opening regions of the hole areas of the protective structure 292 with respect to the illustrated drawing).

Components (e.g., sockets, chipsets, electronic parts, and contacts) disposed on the external interface module 191 may be seated in the hole areas through upper opening regions of the hole areas while the external interface module 191 is being seated on the protective structure 292 fixed to the housing bottom portion 121a of the area of the interface hole 121. While the components disposed on the external interface module 191 are seated in the hole areas of the protective structure 292, a surface of the printed circuit board 191a of the external interface module 191 may be disposed to surround portions around the hole areas of the protective structure 292, and thus the components of the external interface module 191 may be disposed in the hole areas of the protective structure 292 in a sealed state. Accordingly, even though fluid is introduced from the outside, contact of the fluid with the components of the external interface module 191 may be prevented, and the components may be prevented from being corroded or damaged.

According to various embodiments, the upper housing 120b, while being coupled with the lower housing 120a, may apply predetermined pressure to the external interface module 191 disposed on one side of the lower housing 120a. In this regard, a support structure 124 may be disposed on one side of the upper housing 120b (e.g., an area corresponding to the area where the external interface module 191 is disposed). The support structure 124 may have a shape similar to that of the external interface module 191 and may have a predetermined thickness. The support structure 124, when coupled with the lower housing 120a, may press the external interface module 191 toward the lower housing 120a while making contact with at least a portion of the external interface module 191. At least a portion of the support structure 124 may be formed of, for example, at least one of rubber, plastic, PC, or PC+GF30 that has a specified magnitude of elasticity.

Referring to state 703, the external interface module 191 and the protective structure 292 may be disposed between the upper housing 120b and the lower housing 120a. In the illustrated drawing, the protective structure 292 is separately disposed and is illustrated as being seated on one side (e.g., the bottom portion 121a) of the lower housing 120a. However, the disclosure is not limited thereto. For example, the protective structure 292 may be formed on the bottom portion 121a of the lower housing 120a by injection molding. In this case, the protective structure 292 may be closed by the bottom portion 121a of the lower housing 120a and may include a plurality of recess areas that are open at the top. While the external interface module 191 is being coupled to the interface hole 121, components (e.g., sockets, chipsets, electronic parts, and contacts) disposed on the external interface module 191 may be seated in the plurality of recess areas formed on the lower housing 120a by the protective structure 292. Accordingly, the protective structure 292 may support a waterproof or dustproof function for the components of the external interface module 191 and may firmly support the components of the external interface module 191.

According to various embodiments, at least parts of the protective structure 292 may be disposed in the interface holes 121. For example, at least parts of hole mounting portions 91a and 91b of the protective structure 292 that are disposed adjacent to the interface holes 121 may be disposed on inner walls of the interface holes 121. For example, the hole mounting portions 91a and 91b may be formed in a ring shape and may be aligned with the sockets 191_1 and 191_2. Alternatively, at least parts of the hole mounting portions 91a and 91b having a ring shape may be coupled with at least parts of the sockets 191_1 and 191_2.

In state 703, the upper housing 120b may have the support structure 124 disposed thereon as in state 701. The support structure 124 may support a waterproof or dustproof function of preventing fluid infiltration, by blocking clearances between the interface holes 121 and the external interface module 191 while pressing the external interface module 191 and the protective structure 292.

Figure 8:
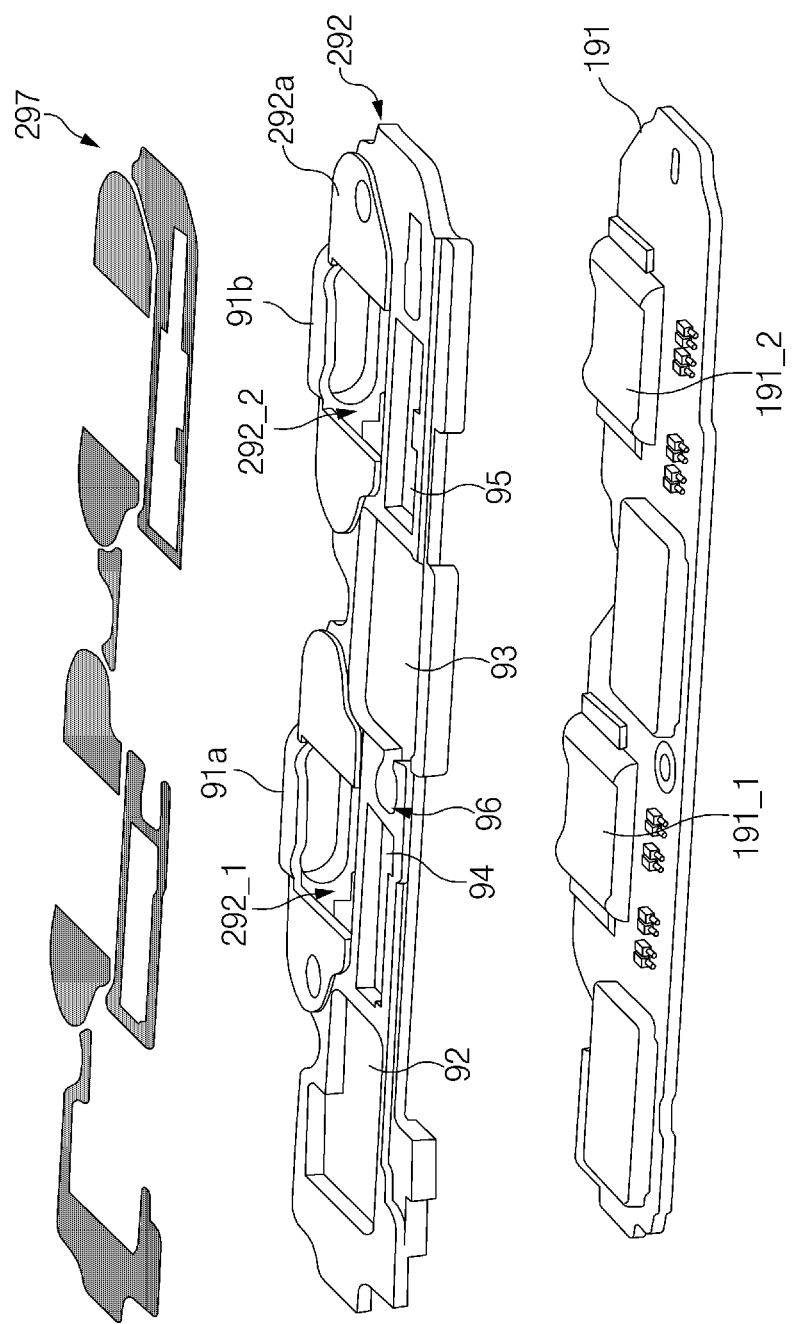
FIG. 8 is a view illustrating one surface of another example of the protective structure according to various embodiments.
Figure 9:
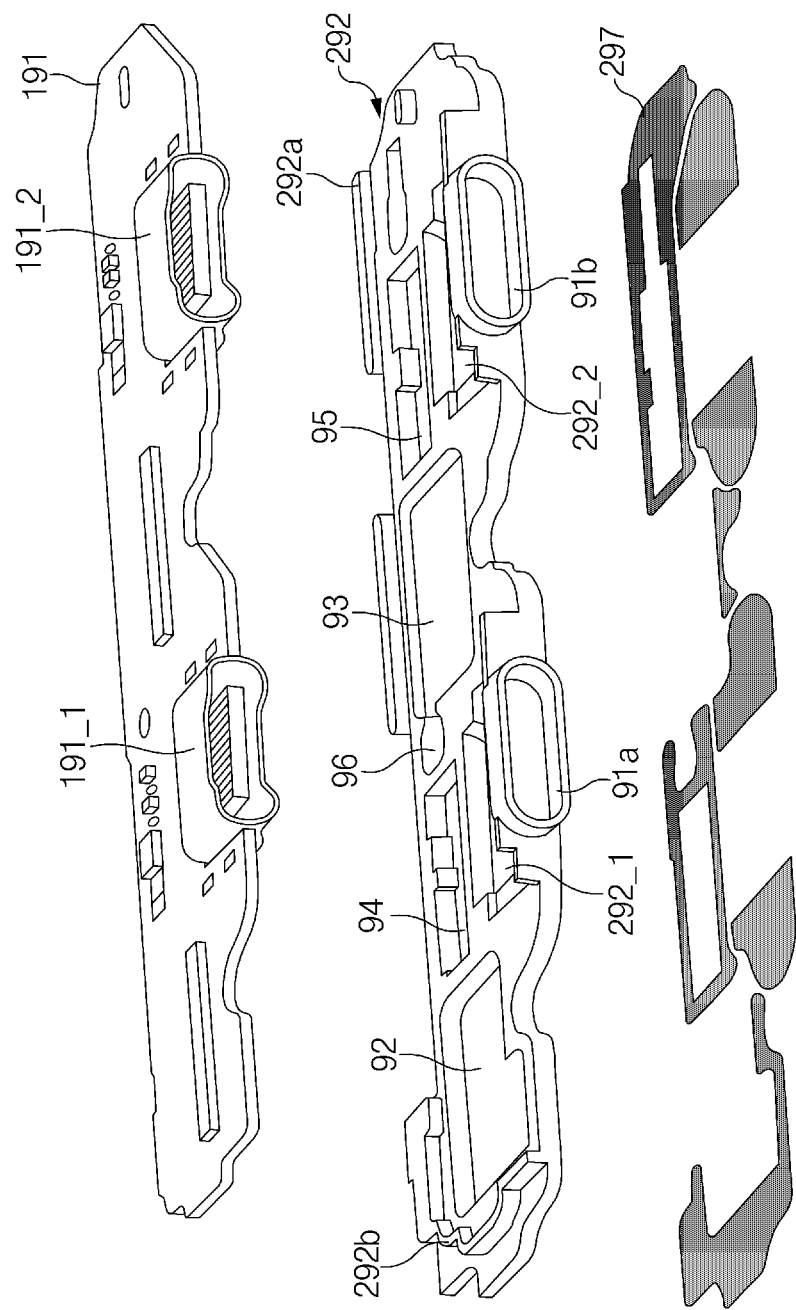
FIG. 9 is a view illustrating another surface of the other example of the protective structure according to various embodiments.

FIG. 8 is a view illustrating one surface of another example of the protective structure according to various embodiments, and FIG. 9 is a view illustrating another surface of the other example of the protective structure according to various embodiments.

Referring to FIGS. 8 and 9, the protective structure 292 according to various embodiments may include a substrate 292a (or a substrate layer), a guide wall 292b, and hole areas 292_1, 292_2, 92, 93, 94, 95, and 96 and may include hole mounting portions 91a and 91b at least partially disposed in the areas of the interface holes 121 (FIG. 7). The hole areas 292_1, 292_2, 92, 93, 94, 95, and 96 may include, for example, the first socket hole 292_1, the second socket hole 292_2, the first chipset hole 92, the second chipset hole 93, the first electronic part hole 94, the second electronic part hole 95, and/or the boss hole 96. Additionally, as described above with reference to the other drawings, the hole areas 292_1, 292_2, 92, 93, 94, 95, and 96 may further include contact holes. The hole mounting portion 91a may be disposed on one side of the socket hole 292_1, and the hole mounting portion 91b may be disposed on one side of the socket hole 292_2. The hole mounting portions 91a and 91b may be formed in a ring shape (or a container shape having an oval cross-section) and may have an outer diameter smaller than the interface holes 121 (FIG. 7) such that at least parts of the hole mounting portions 91a and 91b are seated in the interface holes 121 (FIG. 7).

Furthermore, the hole mounting portions 91a and 91b may have a hollow interior and may be formed such that connectors associated with at least one of external devices or cables are inserted thereinto. The hole mounting portions 91a and 91b may be integrated into the protective structure 292 as parts of the protective structure 292. Accordingly, the hole mounting portions 91a and 91b may be formed of the same material as that of the other areas of the protective structure 292. Alternatively, at least parts of the hole mounting portions 91a and 91b may be formed of a material different from that of the protective structure 292. For example, when the protective structure 292 is formed of PC+GF30, at least parts of the hole mounting portions 91a and 91b may be formed of rubber or PC. The hole mounting portions 91a and 91b may have elasticity to raise the degree of close contact with the connectors. Accordingly, while the connectors of the external devices or the cables are being inserted or extracted, the hole mounting portions 91a and 91b may firmly support the connectors. Furthermore, the hole mounting portions 91a and 91b may support the connectors to prevent the inserted connectors from being easily extracted. In this regard, the sizes of opening areas in the hole mounting portions 91a and 91b may be formed to be equal to or smaller than the sizes of at least partial areas of the connectors.

At least parts of the hole mounting portions 91a and 91b may be aligned with the sockets 191_1 and 191_2 disposed in the external interface module 191, or may be coupled with at least parts of the sockets 191_1 and 191_2. For example, inner sides (e.g., inner side portions facing toward the socket holes 292_1 and 292_2) of the hole mounting portions 91a and 91b may be aligned with front end portions of the sockets 191_1 and 191_2, or may be coupled with at least parts of the front end portions of the sockets 191_1 and 191_2. In this regard, the sizes of the empty areas in the hole mounting portions 91a and 91b may be formed to be equal to or larger than the sizes of the at least parts of the front end portions of the sockets 191_1 and 191_2.

The adhesive member 297 may be seated on the substrate 292a of the protective structure 292. The adhesive member 297 may have an adhesive material applied to at least parts of a front surface and a rear surface thereof, and a surface (e.g., an upper surface with respect to the drawing illustrated in FIG. 8) that is not attached to the substrate 292a of the protective structure 292 may be attached to the bottom portion of the lower housing 120a.

As described above, the protective structure 292 may be fixedly seated on the lower housing through the adhesive member 297 or injection molding, and the external interface module 191 may be seated on the protective structure 292. Accordingly, the protective structure 292 may isolate various parts (e.g., sockets, chipsets, electronic parts, and contacts) disposed in the external interface module 191 from the outside, thereby providing waterproof and dustproof effects for at least a portion of the external interface module 191 and firmly supporting the external interface module 191. For example, the hole mounting portions 91a and 91b of the protective structure 292 may support the sockets 191_1 and 191_2 of the external interface module 191 in four directions of front, back, left, and right, thereby preventing the external interface module 191 from being moved and damaged while a drop impact or an external impact is applied to the electronic device.

According to the various embodiments described above, an electronic device according to an embodiment may include a housing 120 including a front plate 120_1 (e.g., one surface in a direction in which a display 150 is seated, when the direction in which the display 150 is seated in the housing 120 is described as a front surface), a back plate 120_2 facing away from the front plate, and a side member 120_3 (e.g., at least one sidewall in which the interface hole 121 is disposed) that surrounds a space between the front plate and the back plate and that is integrally formed with the back plate, wherein the back plate includes a first portion 120_5 that is adjacent to the side member and is formed of metal and that includes a surface 120_4 facing toward the front plate, the side member includes a first opening 121 (the interface hole) that is adjacent to the first portion and that is formed toward the space 120_7 from the exterior 120_6 of the housing, and the surface includes a recess 121a (a bottom portion of the housing 120) that is adjacent to the first opening, a polymer structure 192 (an example of the protective structure) that is disposed in the space and that includes a second opening (at least one of 92, 93, 94, 95, 96, 97, or 98, the hole area) that is substantially aligned with the recess when viewed from above the recess, an adhesive layer (at least one of 197, 198, or 297, the adhesive member) that is located between the surface and the polymer structure and that attaches the polymer structure to the surface, and an electronic part (at least one part disposed in the housing 120 together with at least one of 191_1 or 191_2 or the socket and associated with a user function provided by the electronic device) that is mounted in the recess through the second opening and that is exposed outside the housing through the first opening.

According to various embodiments, the polymer structure may further include a portion including a third opening (e.g., at least one of 91a or 91b) that is aligned with the first opening.

According to various embodiments, the electronic part may include a printed circuit board (PCB) (e.g., 191a) that includes a connector (at least one of 191_1 or 191_2).

According to the various embodiments described above, an electronic device 100 according to an embodiment may include a housing 120 including a front plate 120_1, a back plate 120_2 facing away from the front plate, and a side member 120_3 surrounding a space 120_7 between the front plate and the back plate, wherein the housing 120 includes a middle plate that is located between the front plate and the back plate and that includes a first portion 120_5 that is integrally formed with side member and is formed of metal and that includes a surface 120_4 facing toward the back plate, the side member includes a first opening 121 (the interface hole) that is adjacent to the first portion and that is formed toward the space from the exterior of the housing, and the surface includes a recess 121a adjacent to the first opening, a polymer structure 192 (the protective structure) that is disposed in the space and that includes a second opening (at least one of 92, 93, 94, 95, 96, 97, or 98, the hole area) that is substantially aligned with the recess when viewed from above the recess, an adhesive layer (at least one of 197, 198, or 297, the adhesive member) that is located between the surface and the polymer structure and that attaches the polymer structure to the surface, and an electronic part (at least one of 191_1 or 191_2 or the socket) that is mounted in the recess through the second opening and that is exposed outside the housing through the first opening.

An electronic device 100 according to an embodiment among the electronic devices according to the various embodiments described above may include an external interface module 191 including a printed circuit board 191a and at least one part (at least one of 82, 83, 84, 85, 87, or 88) disposed on the printed circuit board 191a, a protective structure 192 including at least one hole area (at least one of 93, 94, 95, 97, or 98) that isolates at least a portion of the at least one part, and a housing 120 that provides at least a bottom portion 121a on which the protective structure is seated.

According to various embodiments, the bottom portion of the housing may close at least a portion of the at least one hole area when the protective structure is seated on the bottom portion of the housing.

According to various embodiments, the external interface module may include at least one socket 191_1 or 191_2 to which an external device is connected.

According to various embodiments, the protective structure may include at least one socket hole 192_1 or 192_2 in which the at least one socket is seated.

According to various embodiments, the housing may include at least one interface hole 121 through which at least a portion of the at least one socket is visible from the outside.

According to various embodiments, the protective structure may include at least one hole mounting portion 91a or 91b coupled with a portion of the at least one socket and at least partially mounted in the at least one interface hole.

According to various embodiments, the at least one hole mounting portion may have a ring shape corresponding to a shape of a front end portion of the at least one socket and may be formed in a hollow container shape.

According to various embodiments, the at least one hole mounting portion may surround at least a portion of a front end portion of the at least one socket and may be at least partially mounted in the at least one interface hole.

According to various embodiments, the electronic device may further include at least one seating module (at least one of 193a or 193b) that is disposed between the at least one socket and the at least one interface hole of the housing and that prevents a movement of the at least one socket and prevents inflow of fluid through the at least one interface hole.

According to various embodiments, the external interface module may include at least one chipset (at least one of 82 or 83) for signal processing with a connected external device and at least one electronic part (at least one of 84 or 85) associated with the signal processing of the chipset.

According to various embodiments, the protective structure may include at least one chipset hole (at least one of 92 or 93) in which the at least one chipset is seated and at least one electronic part hole (at least one of 94 or 95) in which the at least one electronic part is seated.

The protective structure may include a substrate 192a, the at least one hole area formed by removing at least a portion of the substrate, and a guide wall 192b extending from a surface of the substrate and having a predetermined width and length.

According to various embodiments, the guide wall may be formed in a wall form protruding from the surface of the substrate by a predetermined height along an edge of the substrate.

According to various embodiments, the guide wall may be formed in a shape corresponding to a shape of one side of the external interface module.

According to various embodiments, the protective structure may be formed on the bottom portion of the housing, based on injection molding.

According to various embodiments, the electronic device may further include an adhesive member (at least one of 197, 198, or 297) disposed between the protective structure and the bottom portion of the housing.

According to various embodiments, the adhesive member may be disposed to cover an area including at least a portion of the at least one hole area of the protective structure and at least a portion around the at least one hole area.

According to various embodiments, the adhesive member may be disposed to cover at least a portion around the at least one hole area of the protective structure.

According to various embodiments, the bottom portion may be formed through CNC machining of at least a portion of the housing, and the at least a portion of the housing may be formed of a metallic material.

At least a portion of the protective structure may be formed of rubber, PC, PC+FG30, or a combination thereof.

Figure 10:
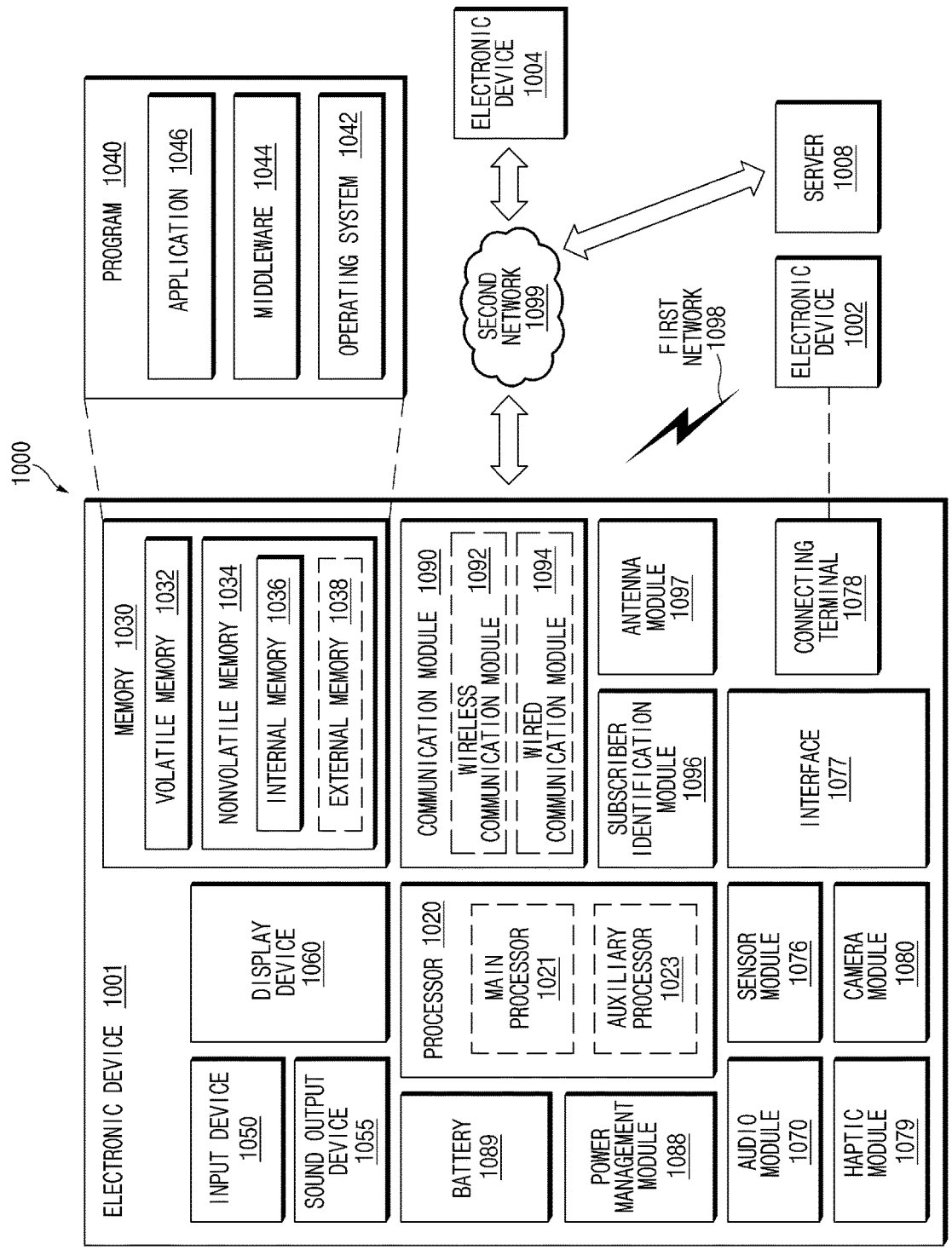
FIG. 10 is a block diagram of an electronic device 1001 in a network environment 1000 according to various embodiments.

FIG. 10 is a block diagram of an electronic device 1001 in a network environment 1000 according to various embodiments. Referring to FIG. 10, the electronic device 1001 may communicate with an electronic device 1002 through a first network 1098 (e.g., a short-range wireless communication network) or may communicate with an electronic device 1004 or a server 1008 through a second network 1099 (e.g., a long-distance wireless communication network) in the network environment 1000. According to an embodiment, the electronic device 1001 may communicate with the electronic device 1004 through the server 1008. According to an embodiment, the electronic device 1001 may include a processor 1020, a memory 1030, an input device 1050, a sound output device 1055, a display device 1060, an audio module 1070, a sensor module 1076, an interface 1077, a haptic module 1079, a camera module 1080, a power management module 1088, a battery 1089, a communication module 1090, a subscriber identification module 1096, or an antenna module 1097. According to some embodiments, at least one (e.g., the display device 1060 or the camera module 1080) among components of the electronic device 1001 may be omitted or one or more other components may be added to the electronic device 1001. According to some embodiments, some of the above components may be implemented with one integrated circuit. For example, the sensor module 1076 (e.g., a fingerprint sensor, an iris sensor, or an illuminance sensor) may be embedded in the display device 1060 (e.g., a display).

The processor 1020 may execute, for example, software (e.g., a program 1040) to control at least one of other components (e.g., a hardware or software component) of the electronic device 1001 connected to the processor 1020 and may process or compute a variety of data. According to an embodiment, as a part of data processing or operation, the processor 1020 may load a command set or data, which is received from other components (e.g., the sensor module 1076 or the communication module 1090), into a volatile memory 1032, may process the command or data loaded into the volatile memory 1032, and may store result data into a nonvolatile memory 1034. According to an embodiment, the processor 1020 may include a main processor 1021 (e.g., a central processing unit or an application processor) and an auxiliary processor 1023 (e.g., a graphic processing device, an image signal processor, a sensor hub processor, or a communication processor), which operates independently from the main processor 1021 or with the main processor 1021. Additionally or alternatively, the auxiliary processor 1023 may use less power than the main processor 1021, or is specified to a designated function. The auxiliary processor 1023 may be implemented separately from the main processor 1021 or as a part thereof.

The auxiliary processor 1023 may control, for example, at least some of functions or states associated with at least one component (e.g., the display device 1060, the sensor module 1076, or the communication module 1090) among the components of the electronic device 1001 instead of the main processor 1021 while the main processor 1021 is in an inactive (e.g., sleep) state or together with the main processor 1021 while the main processor 1021 is in an active (e.g., an application execution) state. According to an embodiment, the auxiliary processor 1023 (e.g., the image signal processor or the communication processor) may be implemented as a part of another component (e.g., the camera module 1080 or the communication module 1090) that is functionally related to the auxiliary processor 1023.

The memory 1030 may store a variety of data used by at least one component (e.g., the processor 1020 or the sensor module 1076) of the electronic device 1001. For example, data may include software (e.g., the program 1040) and input data or output data with respect to commands associated with the software. The memory 1030 may include the volatile memory 1032 or the nonvolatile memory 1034.

The program 1040 may be stored in the memory 1030 as software and may include, for example, an operating system 1042, a middleware 1044, or an application 1046.

The input device 1050 may receive a command or data, which is used for a component (e.g., the processor 1020) of the electronic device 1001, from an outside (e.g., a user) of the electronic device 1001. The input device 1050 may include, for example, a microphone, a mouse, a keyboard, or a digital pen (e.g., a stylus pen).

The sound output device 1055 may output a sound signal to the outside of the electronic device 1001. The sound output device 1055 may include, for example, a speaker or a receiver. The speaker may be used for general purposes, such as multimedia play or recordings play, and the receiver may be used for receiving calls. According to an embodiment, the receiver and the speaker may be either integrally or separately implemented.

The display device 1060 may visually provide information to the outside (e.g., the user) of the electronic device 1001. For example, the display device 1060 may include a display, a hologram device, or a projector and a control circuit for controlling a corresponding device. According to an embodiment, the display device 1060 may include a touch circuitry configured to sense the touch or a sensor circuit (e.g., a pressure sensor) for measuring an intensity of pressure on the touch.

The audio module 1070 may convert a sound and an electrical signal in dual directions. According to an embodiment, the audio module 1070 may obtain the sound through the input device 1050 or may output the sound through the sound output device 1055 or an external electronic device (e.g., the electronic device 1002 (e.g., a speaker or a headphone)) directly or wirelessly connected to the electronic device 1001.

The sensor module 1076 may generate an electrical signal or a data value corresponding to an operating state (e.g., power or temperature) inside or an environmental state (e.g., a user state) outside the electronic device 1001. According to an embodiment, the sensor module 1076 may include, for example, a gesture sensor, a gyro sensor, a barometric pressure sensor, a magnetic sensor, an acceleration sensor, a grip sensor, a proximity sensor, a color sensor, an infrared sensor, a biometric sensor, a temperature sensor, a humidity sensor, or an illuminance sensor.

The interface 1077 may support one or more designated protocols to allow the electronic device 1001 to connect directly or wirelessly to the external electronic device (e.g., the electronic device 1002). According to an embodiment, the interface 1077 may include, for example, an HDMI (high-definition multimedia interface), a USB (universal serial bus) interface, an SD card interface, or an audio interface.

A connecting terminal 1078 may include a connector that physically connects the electronic device 1001 to the external electronic device (e.g., the electronic device 1002). According to an embodiment, the connecting terminal 1078 may include, for example, an HDMI connector, a USB connector, an SD card connector, or an audio connector (e.g., a headphone connector).

The haptic module 1079 may convert an electrical signal to a mechanical stimulation (e.g., vibration or movement) or an electrical stimulation perceived by the user through tactile or kinesthetic sensations. According to an embodiment, the haptic module 1079 may include, for example, a motor, a piezoelectric element, or an electric stimulator.

The camera module 1080 may shoot a still image or a video image. According to an embodiment, the camera module 1080 may include, for example, at least one or more lenses, image sensors, image signal processors, or flashes.

The power management module 1088 may manage power supplied to the electronic device 1001. According to an embodiment, the power management module 1088 may be implemented as at least a part of a power management integrated circuit (PMIC).

The battery 1089 may supply power to at least one component of the electronic device 1001. According to an embodiment, the battery 1089 may include, for example, a non-rechargeable (primary) battery, a rechargeable (secondary) battery, or a fuel cell.

The communication module 1090 may establish a direct (e.g., wired) or wireless communication channel between the electronic device 1001 and the external electronic device (e.g., the electronic device 1002, the electronic device 1004, or the server 1008) and support communication execution through the established communication channel. The communication module 1090 may include at least one communication processor operating independently from the processor 1020 (e.g., the application processor) and supporting the direct (e.g., wired) communication or the wireless communication. According to an embodiment, the communication module 1090 may include a wireless communication module 1092 (e.g., a cellular communication module, a short-range wireless communication module, or a GNSS (global navigation satellite system) communication module) or a wired communication module 1094 (e.g., an LAN (local area network) communication module or a power line communication module). The corresponding communication module among the above communication modules may communicate with the external electronic device through the first network 1098 (e.g., the short-range communication network such as a Bluetooth, a WiFi direct, or an IrDA (infrared data association)) or the second network 1099 (e.g., the long-distance wireless communication network such as a cellular network, an internet, or a computer network (e.g., LAN or WAN)). The above-mentioned various communication modules may be implemented into one component (e.g., a single chip) or into separate components (e.g., chips), respectively. The wireless communication module 1092 may identify and authenticate the electronic device 1001 using user information (e.g., international mobile subscriber identity (IMSI)) stored in the subscriber identification module 1096 in the communication network, such as the first network 1098 or the second network 1099.

The antenna module 1097 may transmit or receive a signal or power to or from the outside (e.g., the external electronic device). According to an embodiment, the antenna module may include an antenna including a radiating element composed of a conductive material or a conductive pattern formed in or on a substrate (e.g., PCB). According to an embodiment, the antenna module 1097 may include a plurality of antennas. In such a case, at least one antenna appropriate for a communication scheme used in the communication network, such as the first network 1098 or the second network 1099, may be selected, for example, by the communication module 1090 from the plurality of antennas. The signal or the power may then be transmitted or received between the communication module 1090 and the external electronic device via the selected at least one antenna. According to an embodiment, another component (e.g., a radio frequency integrated circuit (RFIC)) other than the radiating element may be additionally formed as part of the antenna module 1097.

At least some components among the components may be connected to each other through a communication method (e.g., a bus, a GPIO (general purpose input and output), an SPI (serial peripheral interface), or an MIPI (mobile industry processor interface)) used between peripheral devices to exchange signals (e.g., a command or data) with each other.

According to an embodiment, the command or data may be transmitted or received between the electronic device 1001 and the external electronic device 1004 through the server 1008 connected to the second network 1099. Each of the electronic devices 1002 and 1004 may be the same or different types as or from the electronic device 1001. According to an embodiment, all or some of the operations performed by the electronic device 1001 may be performed by one or more external electronic devices among the external electronic devices 1002, 1004, or 1008. For example, when the electronic device 1001 performs some functions or services automatically or by request from a user or another device, the electronic device 1001 may request one or more external electronic devices to perform at least some of the functions related to the functions or services, in addition to or instead of performing the functions or services by itself. The one or more external electronic devices receiving the request may carry out at least a part of the requested function or service or the additional function or service associated with the request and transmit the execution result to the electronic device 1001. The electronic device 1001 may provide the result as is or after additional processing as at least a part of the response to the request. To this end, for example, a cloud computing, distributed computing, or client-server computing technology may be used.

The electronic device according to various embodiments disclosed in the disclosure may be various types of devices. The electronic device may include, for example, a portable communication device (e.g., a smartphone), a computer device, a portable multimedia device, a mobile medical appliance, a camera, a wearable device, or a home appliance. The electronic device according to an embodiment of the disclosure should not be limited to the above-mentioned devices.

It should be understood that various embodiments of the disclosure and terms used in the embodiments do not intend to limit technical features disclosed in the disclosure to the particular embodiment disclosed herein; rather, the disclosure should be construed to cover various modifications, equivalents, or alternatives of embodiments of the disclosure. With regard to description of drawings, similar or related components may be assigned with similar reference numerals. As used herein, singular forms of noun corresponding to an item may include one or more items unless the context clearly indicates otherwise. In the disclosure disclosed herein, each of the expressions "A or B", "at least one of A and B", "at least one of A or B", "A, B, or C", "one or more of A, B, and C", or "one or more of A, B, or C", and the like used herein may include any and all combinations of one or more of the associated listed items. The expressions, such as "a first", "a second", "the first", or "the second", may be used merely for the purpose of distinguishing a component from the other components, but do not limit the corresponding components in other aspect (e.g., the importance or the order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

The term "module" used in the disclosure may include a unit implemented in hardware, software, or firmware and may be interchangeably used with the terms "logic", "logical block", "part" and "circuit". The "module" may be a minimum unit of an integrated part or may be a part thereof. The "module" may be a minimum unit for performing one or more functions or a part thereof. For example, according to an embodiment, the "module" may include an application-specific integrated circuit (ASIC).

Various embodiments of the disclosure may be implemented by software (e.g., the program 1040) including an instruction stored in a machine-readable storage medium (e.g., an internal memory 1036 or an external memory 1038) readable by a machine (e.g., the electronic device 1001). For example, the processor (e.g., the processor 1020) of a machine (e.g., the electronic device 1001) may call the instruction from the machine-readable storage medium and execute the instructions thus called. This means that the machine may perform at least one function based on the called at least one instruction. The one or more instructions may include a code generated by a compiler or executable by an interpreter. The machine-readable storage medium may be provided in the form of non-transitory storage medium. Here, the term "non-transitory", as used herein, means that the storage medium is tangible, but does not include a signal (e.g., an electromagnetic wave). The term "non-transitory" does not differentiate a case where the data is permanently stored in the storage medium from a case where the data is temporally stored in the storage medium.

According to an embodiment, the method according to various embodiments disclosed in the disclosure may be provided as a part of a computer program product. The computer program product may be traded between a seller and a buyer as a product. The computer program product may be distributed in the form of machine-readable storage medium (e.g., a compact disc read only memory (CD-ROM)) or may be directly distributed (e.g., download or upload) online through an application store (e.g., a Play Store™) or between two user devices (e.g., the smartphones). In the case of online distribution, at least a portion of the computer program product may be temporarily stored or generated in a machine-readable storage medium such as a memory of a manufacturer's server, an application store's server, or a relay server.

According to various embodiments, each component (e.g., the module or the program) of the above-described components may include one or plural entities. According to various embodiments, at least one or more components of the above components or operations may be omitted, or one or more components or operations may be added. Alternatively or additionally, some components (e.g., the module or the program) may be integrated in one component. In this case, the integrated component may perform the same or similar functions performed by each corresponding components prior to the integration. According to various embodiments, operations performed by a module, a programming, or other components may be executed sequentially, in parallel, repeatedly, or in a heuristic method, or at least some operations may be executed in different sequences, omitted, or other operations may be added.

The invention claimed is:

1. An electronic device comprising:
an external interface module including a printed circuit board and a first electronic part and a second electronic part disposed on the printed circuit board;
a protective structure disposed on the printed circuit board, the protective structure including a first hole, seating the first electronic part and a second hole seating the second electronic part, the protective structure including a portion between the first hole and the second hole, wherein the portion of the protective structure is disposed on a portion of the external interface module that is between the first electronic part and the second electronic part; and
a housing providing at least a bottom portion on which the protective structure is seated.

2. The electronic device of claim 1, wherein the bottom portion of the housing closes at least a portion of the first hole or the second hole when the protective structure is seated on the bottom portion of the housing.

3. The electronic device of claim 1, wherein the external interface module includes at least one socket to which an external device is connectable.

4. The electronic device of claim 3, wherein the protective structure includes at least one socket hole in which the at least one socket is seated.

5. The electronic device of claim 4, wherein the housing includes at least one interface hole through which at least a portion of the at least one socket is visible from the outside.

6. The electronic device of claim 5, wherein the protective structure includes at least one hole mounting portion coupled with a portion of the at least one socket and at least partially mounted in the at least one interface hole.

7. The electronic device of claim 6, wherein the at least one hole mounting portion has a ring shape corresponding to a shape of a front end portion of the at least one socket and is formed in a hollow container shape.

8. The electronic device of claim 6, wherein the at least one hole mounting portion surrounds at least a portion of a front end portion of the at least one socket and is at least partially mounted in the at least one interface hole.

9. The electronic device of claim 6, further comprising:
at least one seating module disposed between the at least one socket and the at least one interface hole of the housing and configured to prevent a movement of the at least one socket and prevent inflow of fluid through the at least one interface hole.

10. The electronic device of claim 1, wherein the protective structure includes:
a substrate;
the first hole and the second hole formed by removing at least a portion of the substrate; and
a guide wall extending from a surface of the substrate and having a predetermined width and length.

11. The electronic device of claim 10, wherein the guide wall is provided in a wall form protruding from the surface of the substrate by a predetermined height along an edge of the substrate, or is provided in a shape corresponding to a shape of one side of the external interface module.

12. The electronic device of claim 1, wherein the protective structure is formed on the bottom portion of the housing, based on injection molding.

13. The electronic device of claim 1, further comprising:
an adhesive member disposed between the protective structure and the bottom portion of the housing,
wherein the adhesive member is disposed to cover an area including at least a portion of the first hole or the second hole of the protective structure and at least a portion around the first hole or the second hole, or is disposed to cover at least a portion around the first hole or the second hole of the protective structure.

14. The electronic device of claim 1, wherein the second electronic part comprises a chipset.

* * * * *